United States Patent
Greenberg et al.

(10) Patent No.: US 10,803,215 B2
(45) Date of Patent: Oct. 13, 2020

(54) INCREMENTAL GENERATION OF QUANTUM CIRCUITS

(71) Applicant: International Business Machines Corporation, Armonk, NY (US)

(72) Inventors: Don Greenberg, Teaneck, NJ (US); Marco Pistoia, Amawalk, NY (US); Ali Javadiabhari, Sleepy Hollow, NY (US); Richard Chen, Mount Kisco, NY (US); Jay M. Gambetta, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/223,959

(22) Filed: Dec. 18, 2018

(65) Prior Publication Data

US 2020/0192993 A1    Jun. 18, 2020

(51) Int. Cl.
 *G06F 17/50* (2006.01)
 *G06F 30/30* (2020.01)
 *G06N 10/00* (2019.01)

(52) U.S. Cl.
 CPC ............. *G06F 30/30* (2020.01); *G06N 10/00* (2019.01)

(58) Field of Classification Search
 CPC ........ G06N 10/00; G06N 5/003; G06N 20/00; G06N 3/04; G06F 30/30; G06F 8/40; G06F 8/443; G06F 8/447
 See application file for complete search history.

(56) References Cited

U.S. PATENT DOCUMENTS

| | | | |
|---|---|---|---|
| 9,430,595 B2 | 8/2016 | Pandey et al. | |
| 2004/0122643 A1 | 6/2004 | Anderson et al. | |
| 2014/0041040 A1* | 2/2014 | Potkonjak | G06F 21/64 726/26 |

(Continued)

FOREIGN PATENT DOCUMENTS

WO    2017087347 A1    5/2017

OTHER PUBLICATIONS

A. Venturelli et al., "Temporal Planning for Compilation of Quantum Approximate Optimization Algorithm Circuits", NASA 2017. https://ntrs.nasa.gov/archive/nasa/casi.ntrs.nasa.gov/20170010676.pdf.

(Continued)

*Primary Examiner* — Nghia M Doan
(74) *Attorney, Agent, or Firm* — Garg Law Firm, PLLC; Rakesh Garg; Keivan Razavi

(57) ABSTRACT

A method includes detecting submission of a first quantum circuit for compilation, the first quantum circuit comprising a first set of quantum logic gates; generating a first gate index, the first gate index comprising an ordered table of a subset of the set of quantum logic gates, each quantum logic gate of the subset of quantum logic gates including a corresponding set of qubits acted on by the quantum logic gate; comparing the first gate index with a second gate index to determine a structural equality of the first quantum circuit and the second quantum circuit; and parameterizing, in response to determining a structural equality of the first quantum circuit and the second quantum circuit, a first set of parameters of a second set of quantum logic gates of the second quantum circuit with a second set of parameters of the first set of quantum logic gates.

17 Claims, 5 Drawing Sheets

(56) References Cited

U.S. PATENT DOCUMENTS

| | | | |
|---|---|---|---|
| 2017/0220948 A1 | 8/2017 | Bocharov et al. | |
| 2017/0308803 A1* | 10/2017 | Wallman | G06N 10/00 |
| 2018/0107939 A1 | 4/2018 | Schoennenbeck et al. | |
| 2018/0129966 A1* | 5/2018 | Kliuchnikov | G06N 10/00 |
| 2018/0240035 A1 | 8/2018 | Scheer et al. | |
| 2019/0121921 A1* | 4/2019 | Nam | G06F 30/39 |
| 2019/0205783 A1* | 7/2019 | Nam | G06F 15/8007 |

OTHER PUBLICATIONS

Khatri et al., "Quantum-assisted quantum compiling", arxiv.org, Cornell University Library, 201 Olin Library Cornelll University, Ithaca, NY, Oct. 15, 2018.

Schulte-Herbrueggen et al., "Quantum CISC Compilation by Optimal Control and Scalable Assembly of Complex Instruction Sets beyond Two-Qubit Gates", Nov. 1, 2018.

Khaneja et al., "Optimal control of coupled spin dynamics: design of NMR pulse sequences by gradient ascent algorithms", Journal of Magnetic Resonance, vol. 172, Issue 2, Feb. 2005, pp. 296-305.

Javadiabhari et al., "ScaffCC: a framework for compilation and analysis of quantum computing programs" Computing Frontiers, ACM Digital Library, CF '14: Proceedings of the 11th ACM Conference on Computing Frontiers, May 2014, No. 1.

Gokhale et al., "Partial Compilation of Variational Algorithms for Noisy Intermediate-Scale Quantum Machines", arxiv.org, Cornell Univeristy Library, 201 Olin Library Cornell University Ithaca, NY, Sep. 16, 2019.

Shi et al., "Optimized Compilation of Aggregated Instructions for Realistic Quantum Computers", ASPLOS '19, Apr. 13-17, 2019, Providence, RI, USA.

International Searching Authority, PCT/EP2019/083933, dated Mar. 12, 2020.

* cited by examiner

INCREMENTAL GENERATION OF QUANTUM CIRCUITS

TECHNICAL FIELD

The present invention relates generally to variational algorithms using quantum computing. More particularly, the present invention relates to a method for incremental generation of quantum circuits.

BACKGROUND

Hereinafter, a "Q" prefix in a word of phrase is indicative of a reference of that word or phrase in a quantum computing context unless expressly distinguished where used.

Molecules and subatomic particles follow the laws of quantum mechanics, a branch of physics that explores how the physical world works at the most fundamental levels. At this level, particles behave in strange ways, taking on more than one state at the same time, and interacting with other particles that are very far away. Quantum computing harnesses these quantum phenomena to process information.

The computers we use today are known as classical computers (also referred to herein as "conventional" computers or conventional nodes, or "CN"). A conventional computer uses a conventional processor fabricated using semiconductor materials and technology, a semiconductor memory, and a magnetic or solid-state storage device, in what is known as a Von Neumann architecture. Particularly, the processors in conventional computers are binary processors, i.e., operating on binary data represented in 1 and 0.

A quantum processor (q-processor) uses the odd nature of entangled qubit devices (compactly referred to herein as "qubit," plural "qubits") to perform computational tasks. In the particular realms where quantum mechanics operates, particles of matter can exist in multiple states—such as an "on" state, an "off" state, and both "on" and "off" states simultaneously. Where binary computing using semiconductor processors is limited to using just the on and off states (equivalent to 1 and 0 in binary code), a quantum processor harnesses these quantum states of matter to output signals that are usable in data computing.

Conventional computers encode information in bits. Each bit can take the value of 1 or 0. These 1s and 0s act as on/off switches that ultimately drive computer functions. Quantum computers, on the other hand, are based on qubits, which operate according to two key principles of quantum physics: superposition and entanglement. Superposition means that each qubit can represent both a 1 and a 0 at the same time. Entanglement means that qubits in a superposition can be correlated with each other in a non-classical way; that is, the state of one (whether it is a 1 or a 0 or both) can depend on the state of another, and that there is more information that can be ascertained about the two qubits when they are entangled than when they are treated individually.

Using these two principles, qubits operate as more sophisticated processors of information, enabling quantum computers to function in ways that allow them to solve difficult problems that are intractable using conventional computers. IBM has successfully constructed and demonstrated the operability of a quantum processor using superconducting qubits (IBM is a registered trademark of International Business Machines corporation in the United States and in other countries.)

Quantum algorithms apply quantum operations (quantum gates) on subsets of qubits. Quantum gates are analogous to instructions in a classical computing program. A quantum circuit is a representation of a quantum algorithm using quantum gates. The illustrative embodiments recognize that presently available quantum computing models require quantum algorithms to be specified as quantum circuits on idealized hardware, instead of an actual quantum computer. The illustrative embodiments further recognize that quantum algorithms require mapping into a representation that an actual quantum computer can execute, through a process known as quantum circuit compilation. The illustrative embodiments recognize that compilation often requires adding additional gates to move qubit states to locations where a desired gate acts upon the qubit state due to the physical constraints of the actual quantum computer.

The illustrative embodiments recognize that quantum processors can perform variational algorithms which conventional processors are incapable of performing. The illustrative embodiments further recognize that presently available quantum variational algorithms require quantum circuit compilation for each iteration A conventional processor performs an optimization algorithm that varies the parameters of the wavefunction. A quantum processor computes the corresponding total energy of the wavefunction.

The illustrative embodiments recognize that compilation of each quantum circuit represents a significant amount of the overall run time for the quantum algorithm. The illustrative embodiments further recognize that many quantum algorithms are composed of structurally identical quantum circuits. The illustrative embodiments further recognize that a quantum circuit compiler never changes a temporal order in which a given gate appears on a given set of qubits. For example, an uncompiled quantum circuit can comprise a first and second measure gate on a first qubit. After compilation, the compiled quantum circuit will comprise a first and second measure gate on the first qubit and executed in the same order as the uncompiled quantum circuit.

SUMMARY

The illustrative embodiments provide a method, system, and computer program product for incremental generation of quantum circuits. In an embodiment, a method includes detecting submission of a first quantum circuit for compilation, the first quantum circuit comprising a first set of quantum logic gates. In an embodiment, a method includes generating a first gate index for the first quantum circuit, the first gate index comprising an ordered table of a subset of the set of quantum logic gates, each quantum logic gate of the subset of quantum logic gates including a corresponding set of qubits acted on by the quantum logic gate.

In an embodiment, a method includes comparing the first gate index with a second gate index of a second quantum circuit to determine a structural equality of the first quantum circuit and the second quantum circuit. In an embodiment, a method includes parameterizing, in response to determining a structural equality of the first quantum circuit and the second quantum circuit, a first set of parameters of a second set of quantum logic gates of the second quantum circuit with a second set of parameters of the first set of quantum logic gates. In an embodiment, the second quantum circuit is a previously compiled quantum circuit.

In an embodiment, a method includes compiling, in response to determining a structural inequality of the first quantum circuit and the second quantum circuit, the first quantum circuit. In an embodiment, a structural inequality includes a number of a specific type of quantum logic gate of the first set of quantum logic gates differs from a number of the specific type of quantum logic gate of the second set of quantum logic gates.

In an embodiment, a method includes storing a set of previously compiled quantum circuits in a database. In an embodiment, a structural equality includes a number of each specific type of quantum logic gate of the first set of quantum logic gates equals a number of the same specific type of quantum logic gate of the second set of quantum logic gates.

In an embodiment, the method is embodied in a computer program product comprising one or more computer-readable storage devices and computer-readable program instructions which are stored on the one or more computer-readable tangible storage devices and executed by one or more processors.

An embodiment includes a computer usable program product. The computer usable program product includes a computer-readable storage device, and program instructions stored on the storage device.

An embodiment includes a computer system. The computer system includes a processor, a computer-readable memory, and a computer-readable storage device, and program instructions stored on the storage device for execution by the processor via the memory.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of the illustrative embodiments when read in conjunction with the accompanying drawings, wherein:

DETAILED DESCRIPTION

Figure 1:
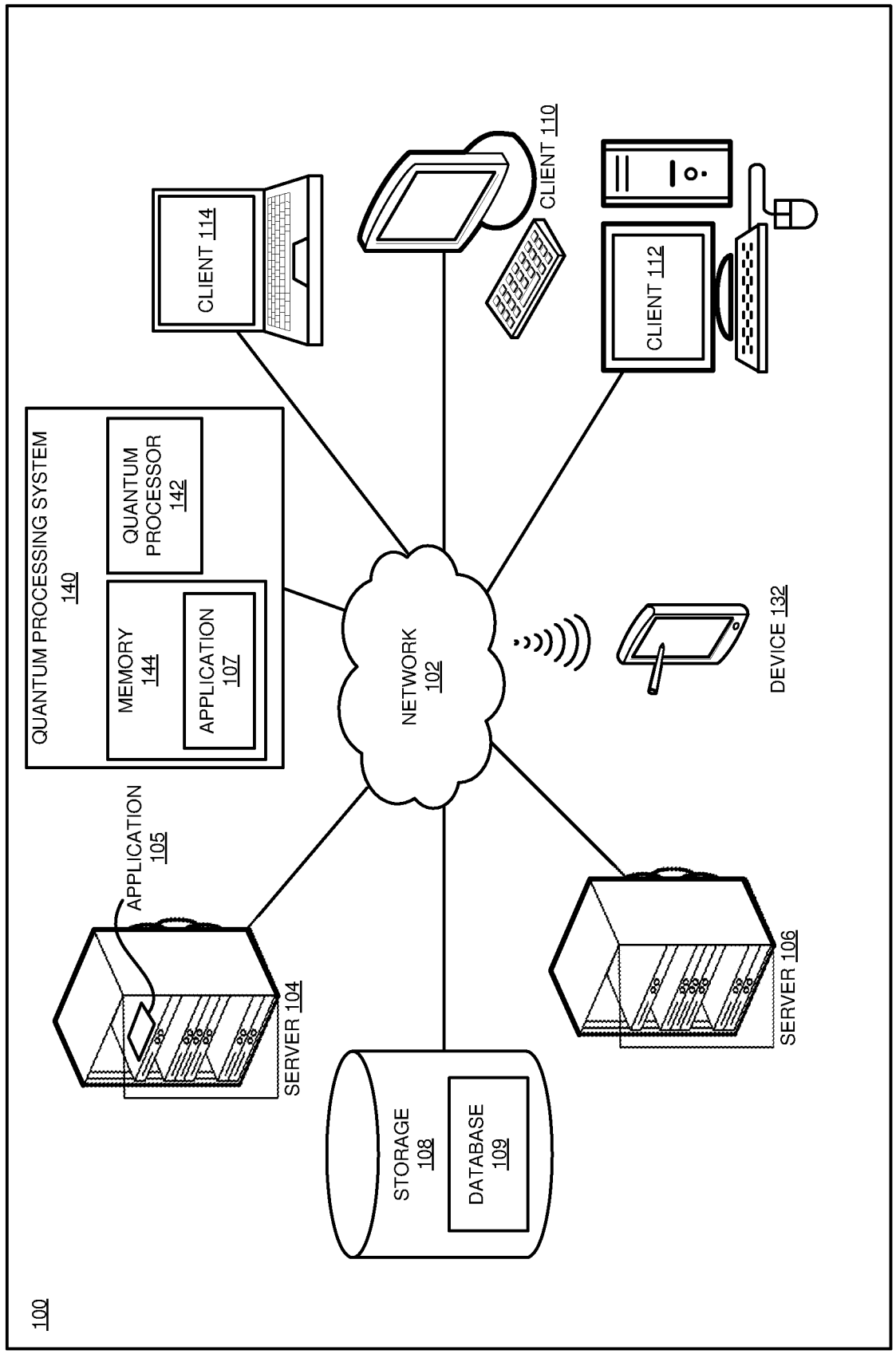
FIG. 1 depicts a block diagram of a network of data processing systems in which illustrative embodiments may be implemented.

The illustrative embodiments used to describe the invention generally address and solve the above-described problems of quantum circuit compilation. The illustrative embodiments provide a method for incremental generation of quantum circuits.

An embodiment provides a method for incremental generation of quantum circuits. Another embodiment provides a quantum computer usable program product comprising a computer-readable storage device, and program instructions stored on the storage device, the stored program instructions comprising a method for incremental generation of quantum circuits. The instructions are executable using a conventional or quantum processor. Another embodiment provides a computer system comprising a conventional or quantum processor, a computer-readable memory, and a computer-readable storage device, and program instructions stored on the storage device for execution by the processor via the memory, the stored program instructions comprising a method for incremental generation of quantum circuits.

The illustrative embodiments recognize that hybrid quantum algorithms, such as variational algorithms, include a handoff between a classical computer generating inputs or modifications to a quantum circuit, running the circuit on a quantum computer, and using the output to serially generate a subsequent quantum circuit. The Variational Quantum Eigensolver (VQE) is one non-limiting example of a variational algorithm performed with quantum computers.

An embodiment detects a first quantum circuit submitted for compilation. The first quantum circuit is an uncompiled quantum circuit. An embodiment compares the first quantum circuit to a previously compiled quantum circuit. For example, an embodiment generates a first list of a first set of quantum gates of the first quantum circuit, each quantum gate acting on a corresponding set of qubits of the first quantum circuit. The embodiment also generates a second list of a second set of quantum gates of the previously compiled quantum circuit, each quantum gate acting on a corresponding set of qubits of the previously compiled quantum circuit.

The embodiment compares the first list to the second list to determine a structural similarity between the first circuit and the previously compiled circuit. In an embodiment, the first circuit and the previously compiled circuit are structurally equal when the number of gates of each type in the first list match the number of gates of each type in the second list. In another example, the embodiment can determine the number of gates of a first gate type in the first list differs from the number of gates of the first gate type in the second list. In response, the embodiment determines the first circuit and the previously compiled circuit fail to be structurally equal. The embodiment compiles, in response to determining the first circuit and the previously compiled circuit fail to be structurally equal, the first circuit.

The embodiment parameterizes, in response to determining the first quantum circuit and the previously compiled circuit are structurally equal, the previously compiled circuit with a set of parameters for the first quantum circuit.

For the clarity of the description, and without implying any limitation thereto, the illustrative embodiments are described using some example configurations. From this disclosure, those of ordinary skill in the art will be able to conceive many alterations, adaptations, and modifications of a described configuration for achieving a described purpose, and the same are contemplated within the scope of the illustrative embodiments.

Furthermore, simplified diagrams of the data processing environments are used in the figures and the illustrative embodiments. In an actual computing environment, additional structures or component that are not shown or described herein, or structures or components different from those shown but for a similar function as described herein may be present without departing the scope of the illustrative embodiments.

Furthermore, the illustrative embodiments are described with respect to specific actual or hypothetical components only as examples. The steps described by the various illustrative embodiments can be adapted using a variety of components that can be purposed or repurposed to provide a described function within a data processing environment, and such adaptations are contemplated within the scope of the illustrative embodiments.

The illustrative embodiments are described with respect to certain types of steps, applications, quantum logic gates, and data processing environments only as examples. Any specific manifestations of these and other similar artifacts are not intended to be limiting to the invention. Any suitable manifestation of these and other similar artifacts can be selected within the scope of the illustrative embodiments.

The examples in this disclosure are used only for the clarity of the description and are not limiting to the illustrative embodiments. Any advantages listed herein are only examples and are not intended to be limiting to the illustrative embodiments. Additional or different advantages may be realized by specific illustrative embodiments. Furthermore, a particular illustrative embodiment may have some, all, or none of the advantages listed above.

Figure 2:
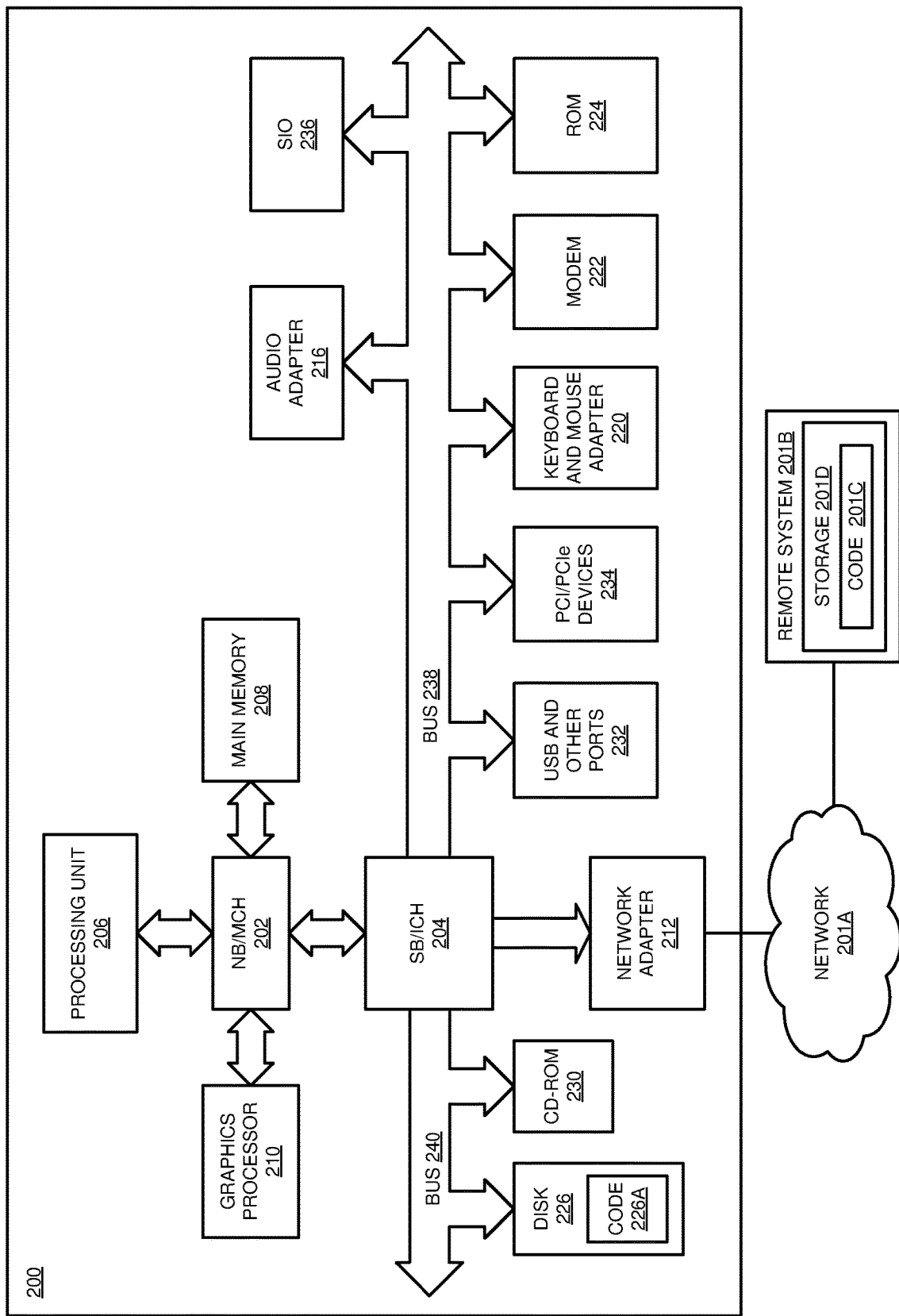
FIG. 2 depicts a block diagram of a data processing system in which illustrative embodiments may be implemented.

With reference to the figures and in particular with reference to FIGS. 1 and 2, these figures are example diagrams of data processing environments in which illustrative embodiments may be implemented. FIGS. 1 and 2 are only examples and are not intended to assert or imply any limitation with regard to the environments in which different embodiments may be implemented. A particular implementation may make many modifications to the depicted environments based on the following description.

FIG. 1 depicts a block diagram of a network of data processing systems in which illustrative embodiments may be implemented. Data processing environment 100 is a network of computers in which the illustrative embodiments may be implemented. Data processing environment 100 includes network 102. Network 102 is the medium used to provide communications links between various devices and computers connected together within data processing environment 100. Network 102 may include connections, such as wire, wireless communication links, or fiber optic cables.

Clients or servers are only example roles of certain data processing systems connected to network 102 and are not intended to exclude other configurations or roles for these data processing systems. Server 106 couples to network 102 along with storage unit 108. Server 106 is a conventional data processing system. Storage unit 108 includes database 109. Database 109 stores a set of previously compiled quantum circuit representations for executing quantum computing processes thereon. Quantum processing system 140 couples to network 102. Quantum processing system 140 is a quantum data processing system. Software applications may execute on any quantum data processing system in data processing environment 100. Any software application described as executing in quantum processing system 140 in FIG. 1 can be configured to execute in another quantum data processing system in a similar manner. Any data or information stored or produced in quantum processing system 140 in FIG. 1 can be configured to be stored or produced in another quantum data processing system in a similar manner. A quantum data processing system, such as quantum processing system 140, may contain data and may have software applications or software tools executing quantum computing processes thereon.

Clients 110, 112, and 114 are also coupled to network 102. A conventional data processing system, such as server 106, or client 110, 112, or 114 may contain data and may have software applications or software tools executing conventional computing processes thereon.

Only as an example, and without implying any limitation to such architecture, FIG. 1 depicts certain components that are usable in an example implementation of an embodiment. For example, server 106, and clients 110, 112, 114, are depicted as servers and clients only as example and not to imply a limitation to a client-server architecture. As another example, an embodiment can be distributed across several conventional data processing systems, quantum data processing systems, and a data network as shown, whereas another embodiment can be implemented on a single conventional data processing system or single quantum data processing system within the scope of the illustrative embodiments. Conventional data processing systems 106, 110, 112, and 114 also represent example nodes in a cluster, partitions, and other configurations suitable for implementing an embodiment.

Device 132 is an example of a conventional computing device described herein. For example, device 132 can take the form of a smartphone, a tablet computer, a laptop computer, client 110 in a stationary or a portable form, a wearable computing device, or any other suitable device. Any software application described as executing in another conventional data processing system in FIG. 1 can be configured to execute in device 132 in a similar manner. Any data or information stored or produced in another conventional data processing system in FIG. 1 can be configured to be stored or produced in device 132 in a similar manner.

Server 106, storage unit 108, quantum processing system 140, and clients 110, 112, and 114, and device 132 may couple to network 102 using wired connections, wireless communication protocols, or other suitable data connectivity. Clients 110, 112, and 114 may be, for example, personal computers or network computers.

In the depicted example, server 106 may provide data, such as boot files, operating system images, and applications to clients 110, 112, and 114. Clients 110, 112, and 114 may be clients to server 106 in this example. Clients 110, 112, 114, or some combination thereof, may include their own data, boot files, operating system images, and applications. Data processing environment 100 may include additional servers, clients, and other devices that are not shown.

In the depicted example, memory 144 may provide data, such as boot files, operating system images, and applications to quantum processor 142. Quantum processor 142 may include its own data, boot files, operating system images, and applications. Data processing environment 100 may include additional memories, quantum processors, and other devices that are not shown. Memory 144 includes application 105 that may be configured to implement one or more of the functions described herein for converging a variational algorithm solution space for quantum computing in accordance with one or more embodiments.

In the depicted example, data processing environment 100 may be the Internet. Network 102 may represent a collection of networks and gateways that use the Transmission Control Protocol/Internet Protocol (TCP/IP) and other protocols to communicate with one another. At the heart of the Internet is a backbone of data communication links between major nodes or host computers, including thousands of commercial, governmental, educational, and other computer systems that route data and messages. Of course, data processing environment 100 also may be implemented as a number of different types of networks, such as for example, an intranet, a local area network (LAN), or a wide area network (WAN). FIG. 1 is intended as an example, and not as an architectural limitation for the different illustrative embodiments.

Among other uses, data processing environment 100 may be used for implementing a client-server environment in which the illustrative embodiments may be implemented. A client-server environment enables software applications and data to be distributed across a network such that an application functions by using the interactivity between a conventional client data processing system and a conventional server data processing system. Data processing environment 100 may also employ a service oriented architecture where interoperable software components distributed across a network may be packaged together as coherent business applications. Data processing environment 100 may also take the form of a cloud, and employ a cloud computing model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service.

With reference to FIG. 2, this figure depicts a block diagram of a data processing system in which illustrative embodiments may be implemented. Data processing system 200 is an example of a conventional computer, such as servers 104 and 106, or clients 110, 112, and 114 in FIG. 1, or another type of device in which computer usable program code or instructions implementing the processes may be located for the illustrative embodiments.

Data processing system 200 is also representative of a conventional data processing system or a configuration therein, such as conventional data processing system 132 in FIG. 1 in which computer usable program code or instructions implementing the processes of the illustrative embodiments may be located. Data processing system 200 is described as a computer only as an example, without being limited thereto. Implementations in the form of other devices, such as device 132 in FIG. 1, may modify data processing system 200, such as by adding a touch interface, and even eliminate certain depicted components from data processing system 200 without departing from the general description of the operations and functions of data processing system 200 described herein.

In the depicted example, data processing system 200 employs a hub architecture including North Bridge and memory controller hub (NB/MCH) 202 and South Bridge and input/output (I/O) controller hub (SB/ICH) 204. Processing unit 206, main memory 208, and graphics processor 210 are coupled to North Bridge and memory controller hub (NB/MCH) 202. Processing unit 206 may contain one or more processors and may be implemented using one or more heterogeneous processor systems. Processing unit 206 may be a multi-core processor. Graphics processor 210 may be coupled to NB/MCH 202 through an accelerated graphics port (AGP) in certain implementations.

In the depicted example, local area network (LAN) adapter 212 is coupled to South Bridge and I/O controller hub (SB/ICH) 204. Audio adapter 216, keyboard and mouse adapter 220, modem 222, read only memory (ROM) 224, universal serial bus (USB) and other ports 232, and PCI/PCIe devices 234 are coupled to South Bridge and I/O controller hub 204 through bus 238. Hard disk drive (HDD) or solid-state drive (SSD) 226 and CD-ROM 230 are coupled to South Bridge and I/O controller hub 204 through bus 240. PCI/PCIe devices 234 may include, for example, Ethernet adapters, add-in cards, and PC cards for notebook computers. PCI uses a card bus controller, while PCIe does not. ROM 224 may be, for example, a flash binary input/output system (BIOS). Hard disk drive 226 and CD-ROM 230 may use, for example, an integrated drive electronics (IDE), serial advanced technology attachment (SATA) interface, or variants such as external-SATA (eSATA) and micro-SATA (mSATA). A super I/O (SIO) device 236 may be coupled to South Bridge and I/O controller hub (SB/ICH) 204 through bus 238.

Memories, such as main memory 208, ROM 224, or flash memory (not shown), are some examples of computer usable storage devices. Hard disk drive or solid state drive 226, CD-ROM 230, and other similarly usable devices are some examples of computer usable storage devices including a computer usable storage medium.

An operating system runs on processing unit 206. The operating system coordinates and provides control of various components within data processing system 200 in FIG. 2. The operating system may be a commercially available operating system for any type of computing platform, including but not limited to server systems, personal computers, and mobile devices. An object oriented or other type of programming system may operate in conjunction with the operating system and provide calls to the operating system from programs or applications executing on data processing system 200.

Instructions for the operating system, the object-oriented programming system, and applications or programs, such as application 105 in FIG. 1, are located on storage devices, such as in the form of code 226A on hard disk drive 226, and may be loaded into at least one of one or more memories, such as main memory 208, for execution by processing unit 206. The processes of the illustrative embodiments may be performed by processing unit 206 using computer implemented instructions, which may be located in a memory, such as, for example, main memory 208, read only memory 224, or in one or more peripheral devices.

Furthermore, in one case, code 226A may be downloaded over network 201A from remote system 201B, where similar code 201C is stored on a storage device 201D. in another case, code 226A may be downloaded over network 201A to remote system 201B, where downloaded code 201C is stored on a storage device 201D.

The hardware in FIGS. 1-2 may vary depending on the implementation. Other internal hardware or peripheral devices, such as flash memory, equivalent non-volatile memory, or optical disk drives and the like, may be used in addition to or in place of the hardware depicted in FIGS. 1-2. In addition, the processes of the illustrative embodiments may be applied to a multiprocessor data processing system.

In some illustrative examples, data processing system 200 may be a personal digital assistant (PDA), which is generally configured with flash memory to provide non-volatile memory for storing operating system files and/or user-generated data. A bus system may comprise one or more buses, such as a system bus, an I/O bus, and a PCI bus. Of course, the bus system may be implemented using any type of communications fabric or architecture that provides for a transfer of data between different components or devices attached to the fabric or architecture.

A communications unit may include one or more devices used to transmit and receive data, such as a modem or a network adapter. A memory may be, for example, main memory 208 or a cache, such as the cache found in North Bridge and memory controller hub 202. A processing unit may include one or more processors or CPUs.

The depicted examples in FIGS. 1-2 and above-described examples are not meant to imply architectural limitations. For example, data processing system 200 also may be a tablet computer, laptop computer, or telephone device in addition to taking the form of a mobile or wearable device.

Where a computer or data processing system is described as a virtual machine, a virtual device, or a virtual component, the virtual machine, virtual device, or the virtual component operates in the manner of data processing system 200 using virtualized manifestation of some or all components depicted in data processing system 200. For example, in a virtual machine, virtual device, or virtual component, processing unit 206 is manifested as a virtualized instance of all or some number of hardware processing units 206 available in a host data processing system, main memory 208 is manifested as a virtualized instance of all or some portion of main memory 208 that may be available in the host data processing system, and disk 226 is manifested as a virtualized instance of all or some portion of disk 226 that may be available in the host data processing system. The host data processing system in such cases is represented by data processing system 200.

Figure 3:
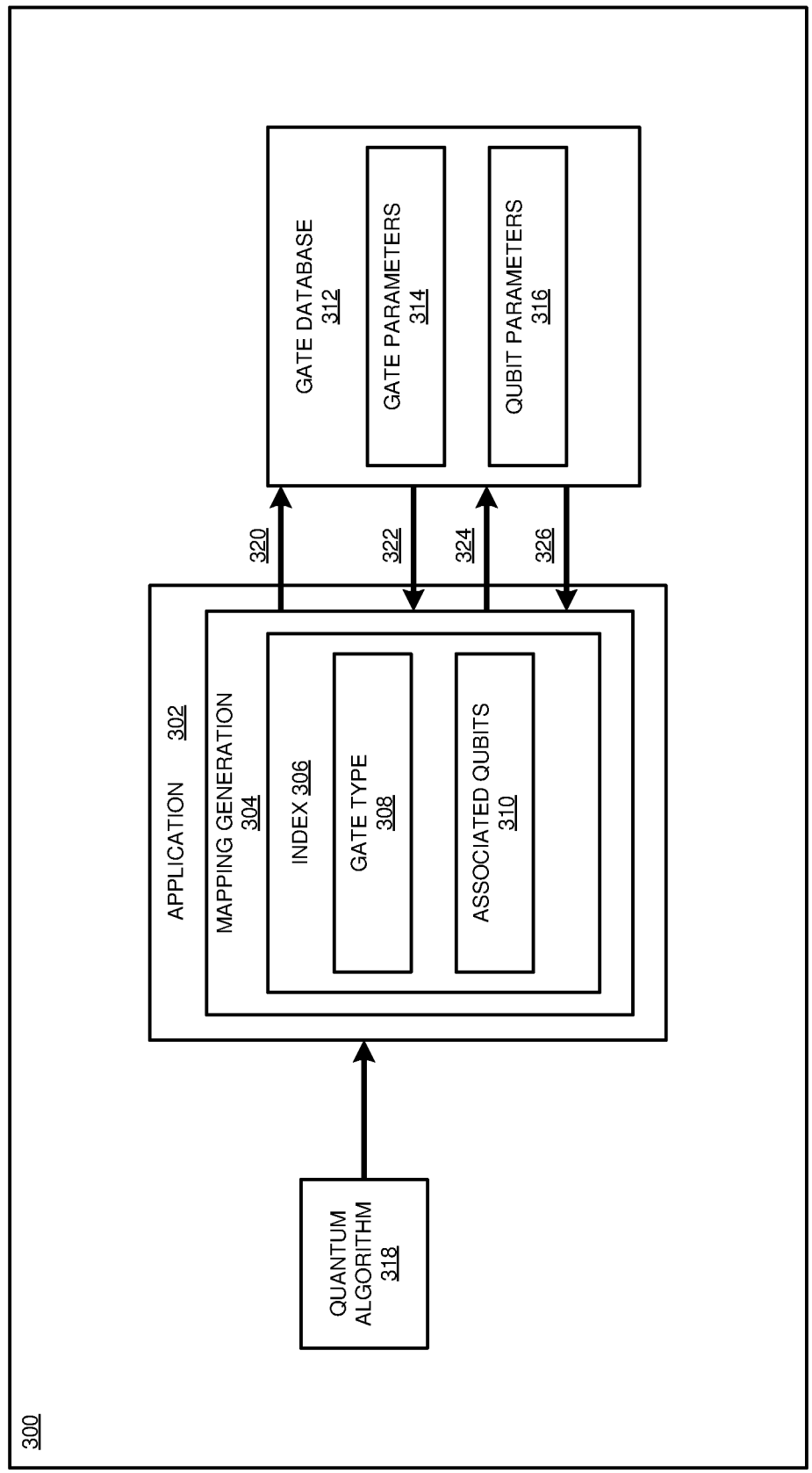
FIG. 3 depicts a block diagram of an example configuration for incremental generation of quantum circuits in accordance with an illustrative embodiment.

With reference to FIG. 3, this figure depicts a block diagram of an example configuration 300 for incremental generation of quantum circuits in accordance with an illustrative embodiment. The example embodiment includes an application 302. In a particular embodiment, application 302 is an example of application 105 or application 107 of FIG. 1.

Application 302 receives a quantum algorithm 318. Quantum algorithm 318 comprises a set of instructions to be executed by a quantum computer. Application 302 includes a mapping generation component 304. Mapping generation component 304 generates an index 306 for an uncompiled quantum circuit of the quantum algorithm 318. In an embodiment, component 304 generates an index for an uncompiled quantum circuit for each iteration of the quantum algorithm. Index 306 includes a set of gate types 308 and a set of associated qubits 310 for each quantum gate in the uncompiled quantum circuit.

Component 304 generates a second index for a compiled quantum circuit stored in database 312. Component 304 executes mapping command 320 to generate the second index 322 for a previously compiled quantum circuit. The second index 322 includes a set of gate types and a set of associated qubits for each quantum gate in the previously compiled quantum circuit. Component 304 executes additional mapping commands 324 to generate additional indices 326 for other previously compiled quantum circuits. Database 312 includes gate parameters 314 and qubit parameters 316.

Figure 4:
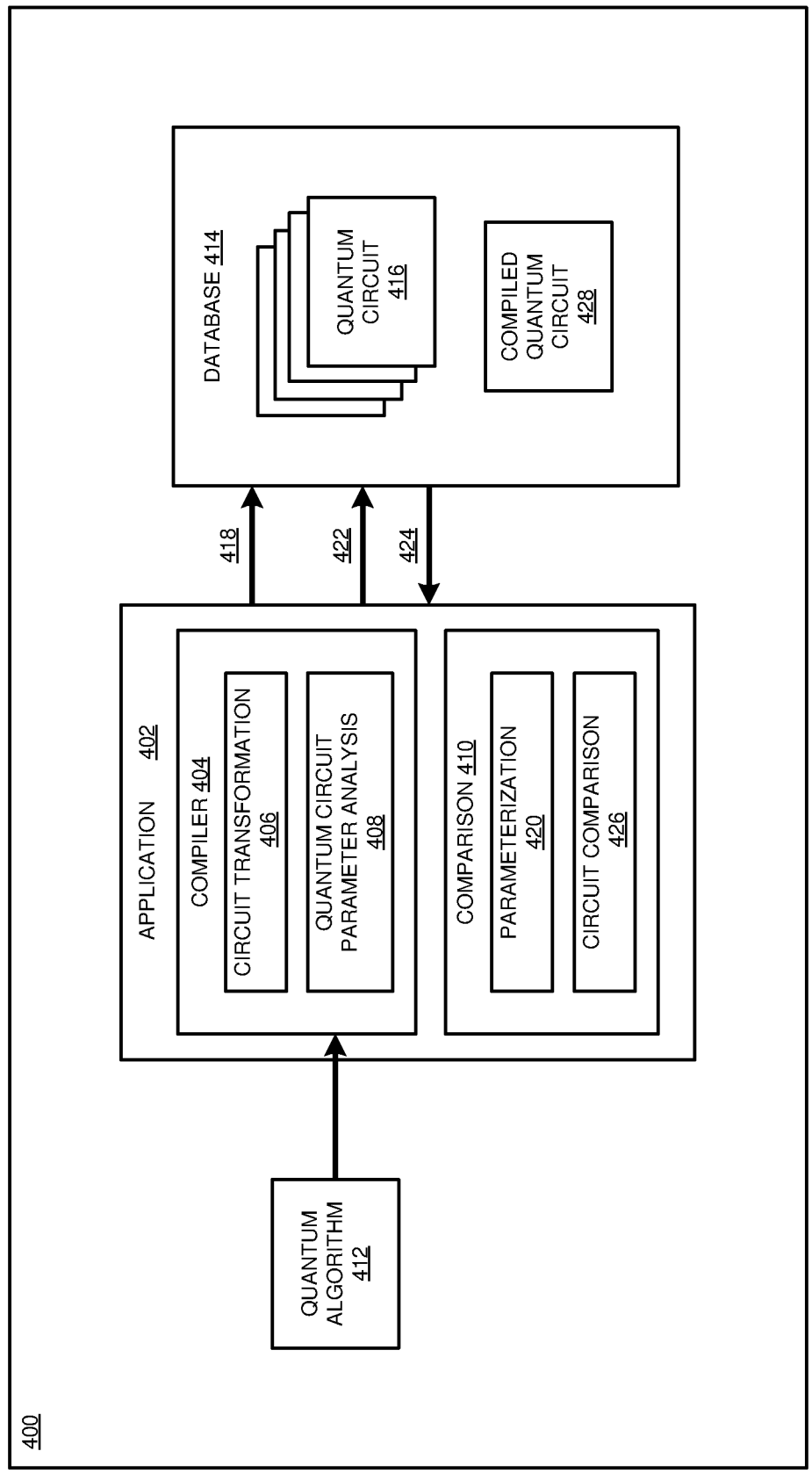
FIG. 4 depicts a block diagram of an example configuration for incremental generation of quantum circuits in accordance with an illustrative embodiment.

With reference to FIG. 4, this figure depicts a block diagram of an example configuration 400 for incremental generation of quantum circuits in accordance with an illustrative embodiment. The example embodiment includes an application 402. In a particular embodiment, application 402 is an example of application 105 or application 107 of FIG. 1.

Application 402 receives a quantum algorithm 412. Quantum algorithm 412 comprises a set of instructions to be executed by a quantum computer. Application 402 includes a compiler component 404 and a comparison component 410. Compiler component 404 includes a circuit transformation component 406 and a quantum circuit parameter analysis component 408. Circuit transformation component 406 generates a quantum circuit from a subset of the set of instructions of the quantum algorithm 412. In an embodiment, compiler component 404 compiles a first quantum circuit 418. Application 402 stores the compiled quantum circuit 428 in the database 414. Database 414 is an example of database 109 in FIG. 1.

Quantum circuit analysis component 408 generates an index for quantum circuits of the quantum algorithm. In an embodiment, component 408 generates an index for a subset of a set 416 of previously compiled quantum circuits.

Comparison component 410 determines a structural similarity between an uncompiled quantum circuit of the quantum algorithm 412 and a previously compiled quantum circuit stored in database 414. In an embodiment, circuit comparison component 426 executes an index command 422 to generate an index 424 of a set of quantum gates and associated qubits for a subset of the set of previously compiled quantum circuits 416. In an embodiment, component 426 compares a first index of an uncompiled quantum circuit with a second index of a previously compiled quantum circuit. For example, component 426 compares a number of a specific type of quantum gate in the first index to a number of the same type of quantum gate in the second index. In response to determining a structural equality of the uncompiled quantum circuit and the previously compiled quantum circuit, component 420 parameterizes the previously compiled quantum circuit with a set of parameters from the uncompiled quantum circuit. In response to determining structural inequality of the uncompiled quantum circuit and the previously compiled quantum circuit, component 404 compiles the uncompiled quantum circuit.

Figure 5:
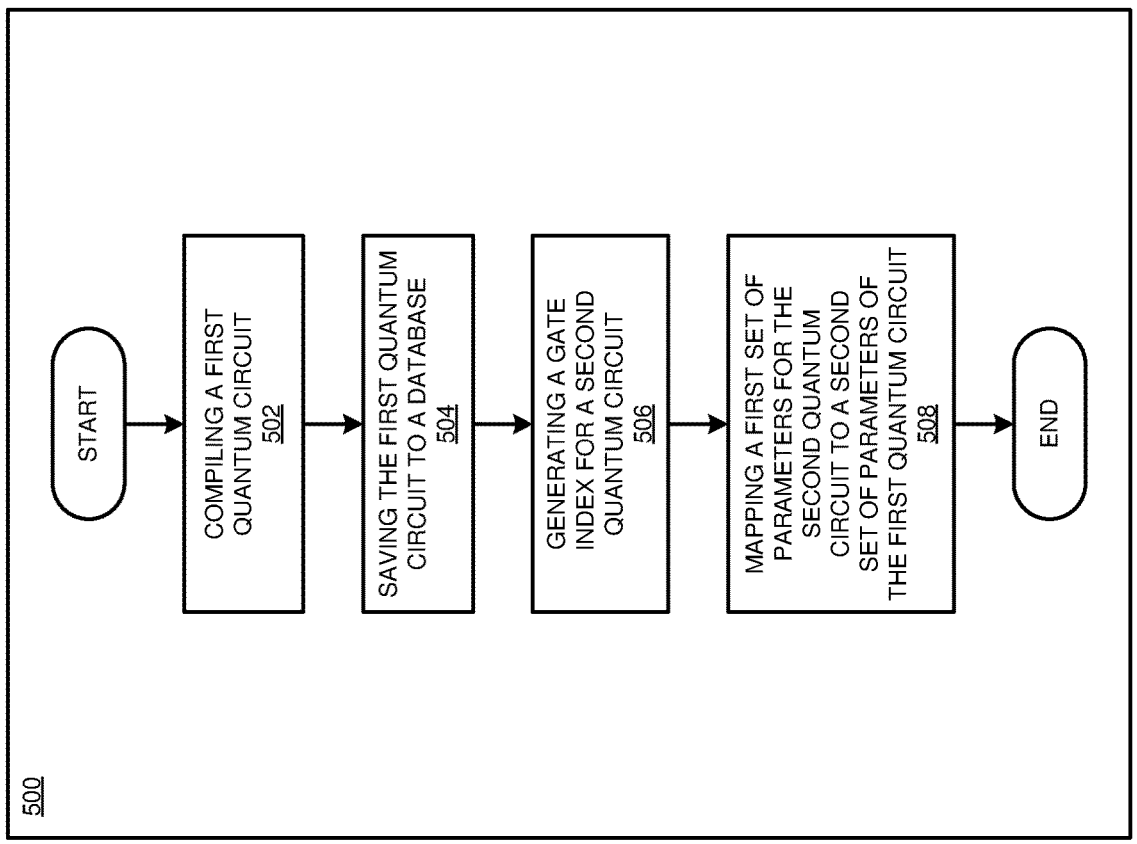
FIG. 5 depicts a flowchart of an example method for incremental generation of quantum circuits in accordance with an illustrative embodiment.

With reference to FIG. 5, this figure depicts a flowchart of an example method 500 for incremental generation of quantum circuits in accordance with an illustrative embodiment. Example method 500 may be performed by application 402 in FIG. 4.

In block 502, application 402 compiles a first quantum circuit from a quantum algorithm. In block 504, application 402 stores the compiled quantum circuit in a database. In block 506, application 402 generates a gate index for an uncompiled second quantum circuit from the quantum algorithm. In an embodiment, application 402 detects the second quantum circuit is submitted for compilation. In an embodiment, application 402 generates a first gate index including a set of quantum gates of the previously compiled first quantum circuit, each quantum gate including a corresponding subset of a set of qubits acted on by the quantum gate. In an embodiment, application 402 generates a second gate index including a set of quantum gates of the uncompiled second quantum circuit, each quantum gate including a corresponding subset of a set of qubits acted on by the quantum gate.

In an embodiment, application 402 compares the first gate index and the second gate index to determine a structural similarity between the first quantum circuit and the second quantum circuit. In response to determining the first quantum circuit and the second quantum circuit are structurally dissimilar, application 402 compiles the second quantum circuit. In block 508, in response to determining the first quantum circuit and the second quantum circuit are structurally equal, application 402 maps a first set of parameters for the second quantum circuit to the first quantum circuit.

Various embodiments of the present invention are described herein with reference to the related drawings. Alternative embodiments can be devised without departing from the scope of this invention. For example, additional variational algorithms for quantum computing may be included in of method 500 without departing from the scope of the present invention.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "illustrative" is used herein to mean "serving as an example, instance or illustration." Any embodiment or design described herein as "illustrative" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method comprising:
   detecting submission of a first quantum circuit for compilation, the first quantum circuit comprising a first set of quantum logic gates;
   generating a first gate index for the first quantum circuit, the first gate index comprising the first set of quantum logic gates, each quantum logic gate of the first set of quantum logic gates including a corresponding set of qubits acted on by the quantum logic gate;
   comparing the first gate index with a second gate index of a second quantum circuit to determine a structural equality of the first quantum circuit and the second quantum circuit; and
   parameterizing, in response to determining a structural equality of the first quantum circuit and the second quantum circuit, a first set of parameters of a second set of quantum logic gates of the second quantum circuit with a second set of parameters of the first set of quantum logic gates,
   wherein the second quantum circuit is a previous complied quantum circuit stored in a database; and
   wherein the comparing of the first gate index with the second gate index includes comparing a number of a specific type of quantum logic gate of the first gate index with a number of the specific type of quantum logic gate of the second gate index.

2. The method of claim 1, further comprising:
   compiling, in response to determining a structural inequality of the first quantum circuit and the second quantum circuit, the first quantum circuit.

3. The method of claim 2, wherein a structural inequality includes a number of a specific type of quantum logic gate of the first set of quantum logic gates differs from a number of the specific type of quantum logic gate of the second set of quantum logic gates.

4. The method of claim 1, further comprising:
   storing a set of previously compiled quantum circuits in a database.

5. The method of claim 1, wherein a structural equality includes a number of each specific type of quantum logic gate of the first set of quantum logic gates equals a number of the same specific type of quantum logic gate of the second set of quantum logic gates.

6. A computer usable program product comprising a computer-readable storage device, and program instructions stored on the storage device, the stored program instructions comprising:
   program instructions to detect submission of a first quantum circuit for compilation, the first quantum circuit comprising a first set of quantum logic gates;
   program instructions to generate a first gate index for the first quantum circuit, the first gate index comprising the first set of quantum logic gates, each quantum logic gate of the first set of quantum logic gates including a corresponding set of qubits acted on by the quantum logic gate;
   program instruction to compare the first gate index with a second gate index of a second quantum circuit to determine a structural similarity of the first quantum circuit and the second quantum circuit; and
   program instruction to parameterize, in response to determining a structural equality of the first quantum circuit and the second quantum circuit, a first set of parameters of a second set of quantum logic gates of the second quantum circuit with a second set of parameters of the first set of quantum logic gates,
   wherein the second quantum circuit is a previous complied quantum circuit stored in a database; and
   wherein the comparing of the first gate index with the second gate index includes comparing a number of a specific type of quantum logic gate of the first gate index with a number of the specific type of quantum logic gate of the second gate index.

7. The computer usable program product of claim 6, wherein the computer usable code is stored in a computer readable storage device in a data processing system, and wherein the computer usable code is transferred over a network from a remote data processing system.

8. The computer usable program product of claim 7, wherein the computer usable code is stored in a computer readable storage device in a server data processing system, and wherein the computer usable code is downloaded over a network to a remote data processing system for use in a computer readable storage device associated with the remote data processing system.

9. The computer usable program product of claim 6, the stored program instructions further comprising:
   program instructions to compile, in response to determining a structural inequality of the first quantum circuit and the second quantum circuit, the first quantum circuit.

10. The computer usable program product of claim 9, wherein a structural inequality includes a number of a specific type of quantum logic gate of the first set of quantum logic gates differs from a number of the specific type of quantum logic gate of the second set of quantum logic gates.

11. The computer usable program product of claim 6, the stored program instructions comprising:
   program instructions to store a set of previously compiled quantum circuits in a database.

12. The computer usable program product of claim 6, wherein a structural equality includes a number of each specific type of quantum logic gate of the first set of quantum logic gates equals a number of the same specific type of quantum logic gate of the second set of quantum logic gates.

13. A computer system comprising a processor, a computer-readable memory, and a computer-readable storage device, and program instructions stored on the storage device for execution by the processor via the memory, the stored program instructions comprising:
   program instructions to detect submission of a first quantum circuit for compilation, the first quantum circuit comprising a first set of quantum logic gates;
   program instructions to generate a first gate index for the first quantum circuit, the first gate index comprising the first set of quantum logic gates, each quantum logic gate of the subset first set of quantum logic gates including a corresponding set of qubits acted on by the quantum logic gate;
   program instruction to compare the first gate index with a second gate index of a second quantum circuit to determine a structural similarity of the first quantum circuit and the second quantum circuit; and
   program instruction to parameterize, in response to determining a structural equality of the first quantum circuit and the second quantum circuit, a first set of parameters of a second set of quantum logic gates of the second quantum circuit with a second set of parameters of the first set of quantum logic gates,
   wherein the second quantum circuit is a previous complied quantum circuit stored in a database; and
   wherein the comparing of the first gate index with the second gate index includes comparing a number of a specific type of quantum logic gate of the first gate index with a number of the specific type of quantum logic gate of the second gate index.

14. The computer system of claim 13, the stored program instructions further comprising:
   program instructions to compile, in response to determining a structural inequality of the first quantum circuit and the second quantum circuit, the first quantum circuit.

15. The computer system of claim 14, wherein a structural inequality includes a number of a specific type of quantum logic gate of the first set of quantum logic gates differs from a number of the specific type of quantum logic gate of the second set of quantum logic gates.

16. The computer system of claim 13, the stored program instruction further comprising:
   program instructions to store a set of previously compiled quantum circuits in a database.

17. The computer system of claim 13, wherein a structural equality includes a number of each specific type of quantum logic gate of the first set of quantum logic gates equals a number of the same specific type of quantum logic gate of the second set of quantum logic gates.

* * * * *